United States Patent
Tzafrir

(10) Patent No.: US 9,355,929 B2
(45) Date of Patent: May 31, 2016

(54) DATA STORAGE BASED UPON TEMPERATURE CONSIDERATIONS

(75) Inventor: Yonatan Tzafrir, Petah Tikva (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 335 days.

(21) Appl. No.: 13/455,866

(22) Filed: Apr. 25, 2012

(65) Prior Publication Data

US 2013/0290600 A1    Oct. 31, 2013

(51) Int. Cl.
*G06F 12/00*    (2006.01)
*H01L 23/34*    (2006.01)
*G06F 11/00*    (2006.01)
*G06F 11/30*    (2006.01)
*G11C 16/34*    (2006.01)

(52) U.S. Cl.
CPC .............. *H01L 23/34* (2013.01); *G06F 11/004* (2013.01); *G06F 11/3037* (2013.01); *G06F 11/3058* (2013.01); *G11C 16/3418* (2013.01); *G06F 11/3089* (2013.01); *G06F 2212/7208* (2013.01); *H01L 2924/0002* (2013.01)

(58) Field of Classification Search
USPC .......................................... 711/103; 700/299
See application file for complete search history.

(56) References Cited

U.S. PATENT DOCUMENTS

| 6,034,897 | A | 3/2000 | Estakhri et al. |
| 7,590,473 | B2 | 9/2009 | Wyatt |
| 7,936,616 | B2 | 5/2011 | Jeong |
| 2005/0144516 | A1 | 6/2005 | Gonzalez et al. |
| 2007/0191993 | A1* | 8/2007 | Wyatt ............................ 700/299 |
| 2008/0052446 | A1 | 2/2008 | Lasser et al. |
| 2008/0162787 | A1* | 7/2008 | Tomlin et al. ................. 711/103 |
| 2010/0205464 | A1 | 8/2010 | Rotem et al. |
| 2013/0159766 | A1* | 6/2013 | D'Abreu et al. ............... 714/6.3 |

* cited by examiner

*Primary Examiner* — Jared Rutz
*Assistant Examiner* — Christopher Do
(74) *Attorney, Agent, or Firm* — Toler Law Group, PC

(57) ABSTRACT

A method includes, in a nonvolatile memory device that includes a plurality of dies, detecting that a first temperature associated with a first die is equal to or exceeds a temperature threshold. A metablock is defined to include a first plurality of storage blocks that includes a first storage block of the first die. Each storage block of the metablock resides in a distinct die of the plurality of dies. The method also includes, in response to detecting that the first temperature is equal to or exceeds the temperature threshold, redefining the metablock to exclude from the redefined metablock any storage block associated with the first die.

21 Claims, 5 Drawing Sheets

DATA STORAGE BASED UPON TEMPERATURE CONSIDERATIONS

FIELD OF THE DISCLOSURE

The present disclosure is generally related to data storage based on temperature of a medium of data storage.

BACKGROUND

Nonvolatile data storage devices, such as universal serial bus (USB) flash memory devices or removable storage cards, have resulted in increased portability of data and software applications. Nonvolatile data storage devices can store data received from a host device, such as a cellular telephone, a media player, or another user device, and can provide the stored data upon request from the host device. The faster the data transfer to and from a nonvolatile data storage device, the more quickly the data can be utilized by the host device.

Data transfer to and from a data storage device can result in generation of heat due to current flow in and out of the data storage device during storage and/or data retrieval. When the data storage device heats up, stored data may be more prone to error while in storage when storage elements are less stable at higher temperatures than at lower temperatures. Heat may also be transferred between adjacent dies within a storage device and may contribute to an elevated temperature within the data storage device.

A storage device that has an elevated temperature may be cooled by completely refraining from transferring data to and from the data storage device. However, refraining from transferring data for a period of time slows an overall data transfer rate to and from the data storage device.

SUMMARY

A temperature of a first die of a data storage device may be reduced by redirecting data flow from a first storage block in the first die to a second storage block in a second die of the data storage device. Data flow may be redirected by redefining a metablock of the data storage device. A metablock is a unit of data storage that is defined to include a selected plurality of storage blocks within the data storage device that can be accessed substantially simultaneously. For example, a metablock can include a single storage block from each die of the storage device or from each die of a subset of dies of the storage device.

By redefining the metablock to include the second storage block in the second die and to exclude any storage block from the first die, data flow may be redirected away from the first die. Redirecting data flow from the first storage block of the first die to the second storage block of the second die can reduce heat generated in the first die, permitting cooling of the first die and reduction of the temperature of the first die without completely stopping all data transfer to and from the data storage device.

DETAILED DESCRIPTION

Figure 1:
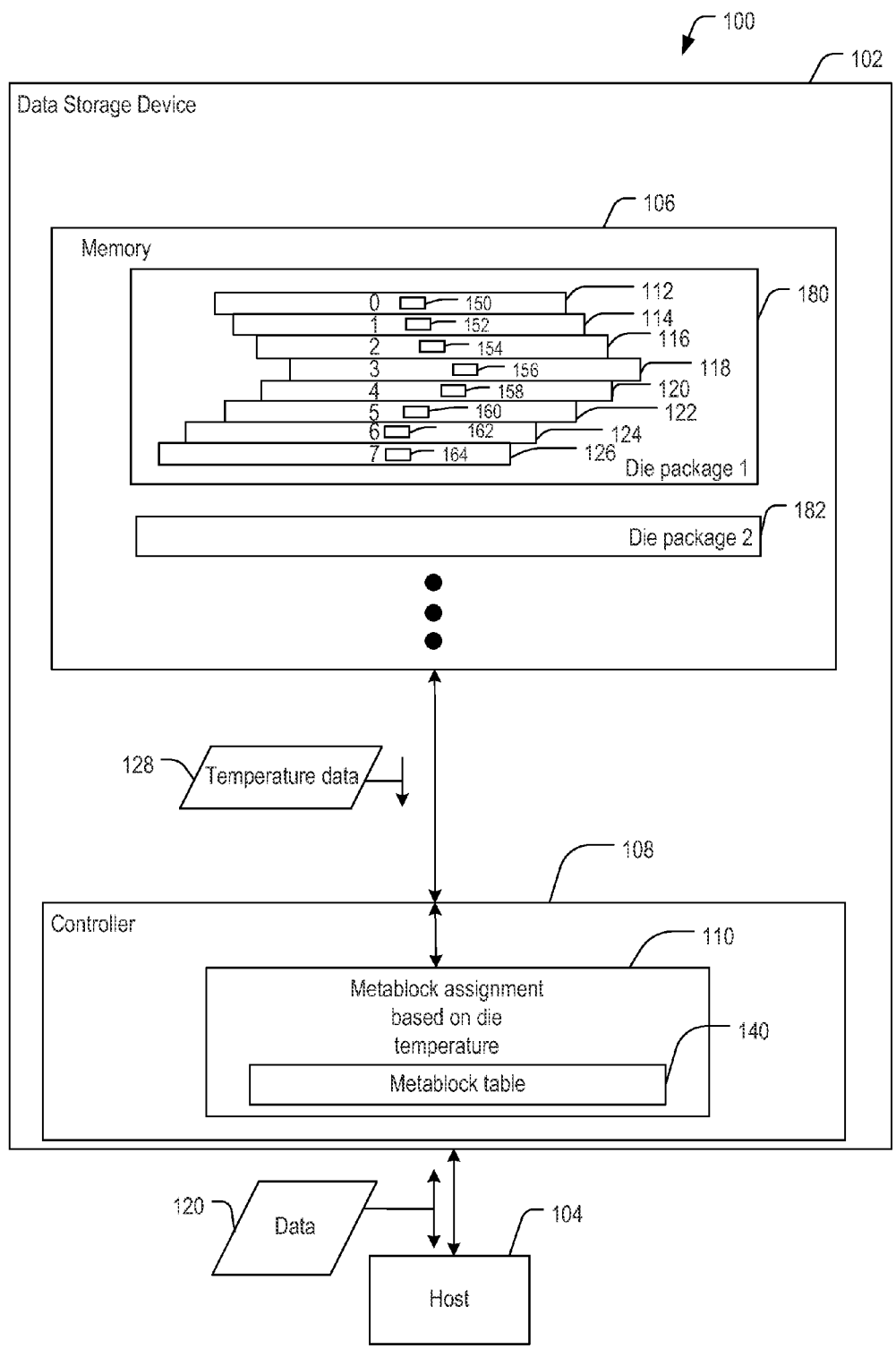
FIG. 1 is a diagram of a particular illustrative embodiment of a system including a data storage device configured to reconfigure a metablock in response to temperature measurements of one or more dies of a non-volatile memory.

Referring to FIG. 1, a particular embodiment of a system 100 includes a data storage device 102 coupled to a host device 104. The data storage device 102 includes a memory 106 coupled to a controller 108. The controller 108 is configured to redefine a metablock based on a measured temperature of the memory 106 to cool the data storage device 102 without completely stopping all data transfer to and from the data storage device 102.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be embedded memory in a host device, such as eMMC® (trademark of JEDEC Solid State Technology Association, Arlington, Va.) memory and eSD memory, as illustrative examples.

The host device 104 may be configured to provide data 120 to be stored at the data storage device 102 or to request the data 120 to be read from the data storage device 102. The host device 104 may include, for example, a mobile telephone, a music player or video player, a gaming console, an electronic book reader, a personal digital assistant (PDA), a computer, such as a laptop computer, a notebook computer, or a tablet, any other electronic device, or any combination thereof.

The memory 106 includes one or more die packages, including a die package 180. The memory 106 may also include a die package 182, and one or more additional die packages (not shown). The die package 180 includes dies 112, 114, 116, 118, 120, 122, 124, and 126. Any of the other die packages within the memory 106 may include a same number of dies as the die package 180 or may include more or less dies than the die package 180.

Each die within the die package 180 includes a temperature sensor. For example, the die 112 includes temperature sensor 150. The die 114 includes temperature sensor 152. The die 116 includes temperature sensor 154. The die 118 includes temperature sensor 156. The die 120 includes temperature sensor 158. The die 122 includes temperature sensor 160. The die 124 includes temperature sensor 162. The die 126 includes temperature sensor 164.

Each of the temperature sensors 150-164 may measure temperature of the die on which the temperature sensor is affixed. For example, the temperature sensor 150 may produce temperature data corresponding to a temperature of the die 112. Temperature data from one or more of the temperature sensors 150-164 may be transmitted from the memory 106 to the controller 108 as temperature data 128.

Each of the dies 112-126 may include a plurality of storage blocks capable of storing data, such as the data 120 from the host device 104. For instance, the data 120 may be received by the data storage device 102 from the host device 104, and the data 120 may be stored within storage blocks in any of the dies 112-126.

The controller 108 is configured to receive data and instructions from and to send data to the host device 104 while the data storage device 102 is operatively coupled to the host device 104. The controller 108 is further configured to send data and commands to the memory 106 and to receive data from the memory 106. For example, the controller 108 is configured to send data and a write command to instruct the memory 106 to store the data to a specified address. As another example, the controller 108 is configured to send a read command to read data from a specified address of the memory 106.

The controller 108 includes a metablock assignment module 110. The metablock assignment module 110 may include a metablock table 140 that includes information pertaining to one or more metablocks associated with the memory 106. The controller 108 may be configured to maintain the metablock table 140 to specify each storage block in a metablock. Typically, a metablock includes a single block from each die of a set of distinct dies. A metablock can also include a single block from each of a set of distinct planes. The blocks in a metablock may be accessed simultaneously and/or erased simultaneously. For example, the controller 108 may be configured to address each storage block of a metablock substantially simultaneously. In an embodiment, the controller 108 is configured, in response to receipt of an erase command, to erase each storage block of the metablock substantially simultaneously.

Figure 2:
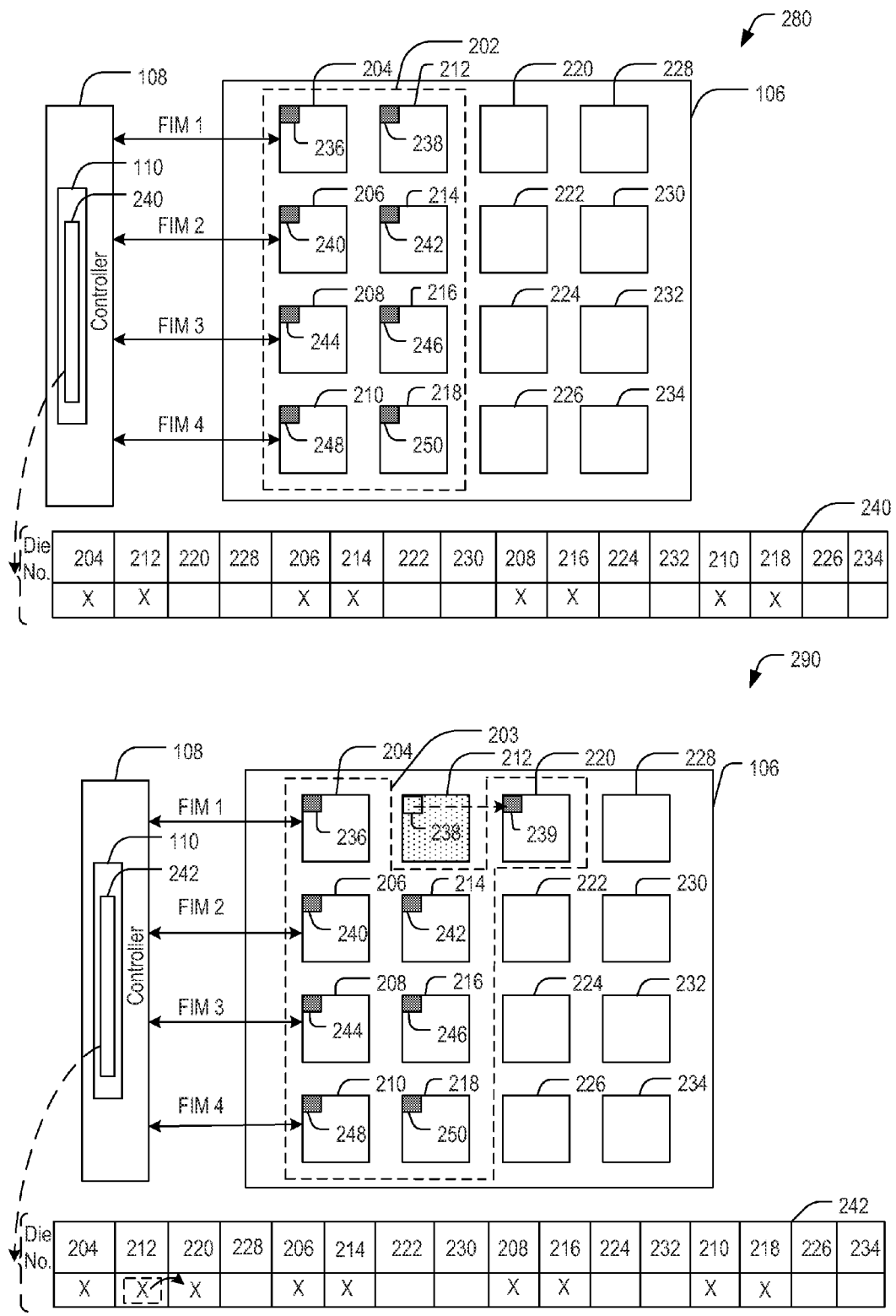
FIG. 2 is a general diagram illustrating a first embodiment of redefining a first metablock to exclude a particular storage block of a particular die of the data storage device of FIG. 1.
Figure 3:
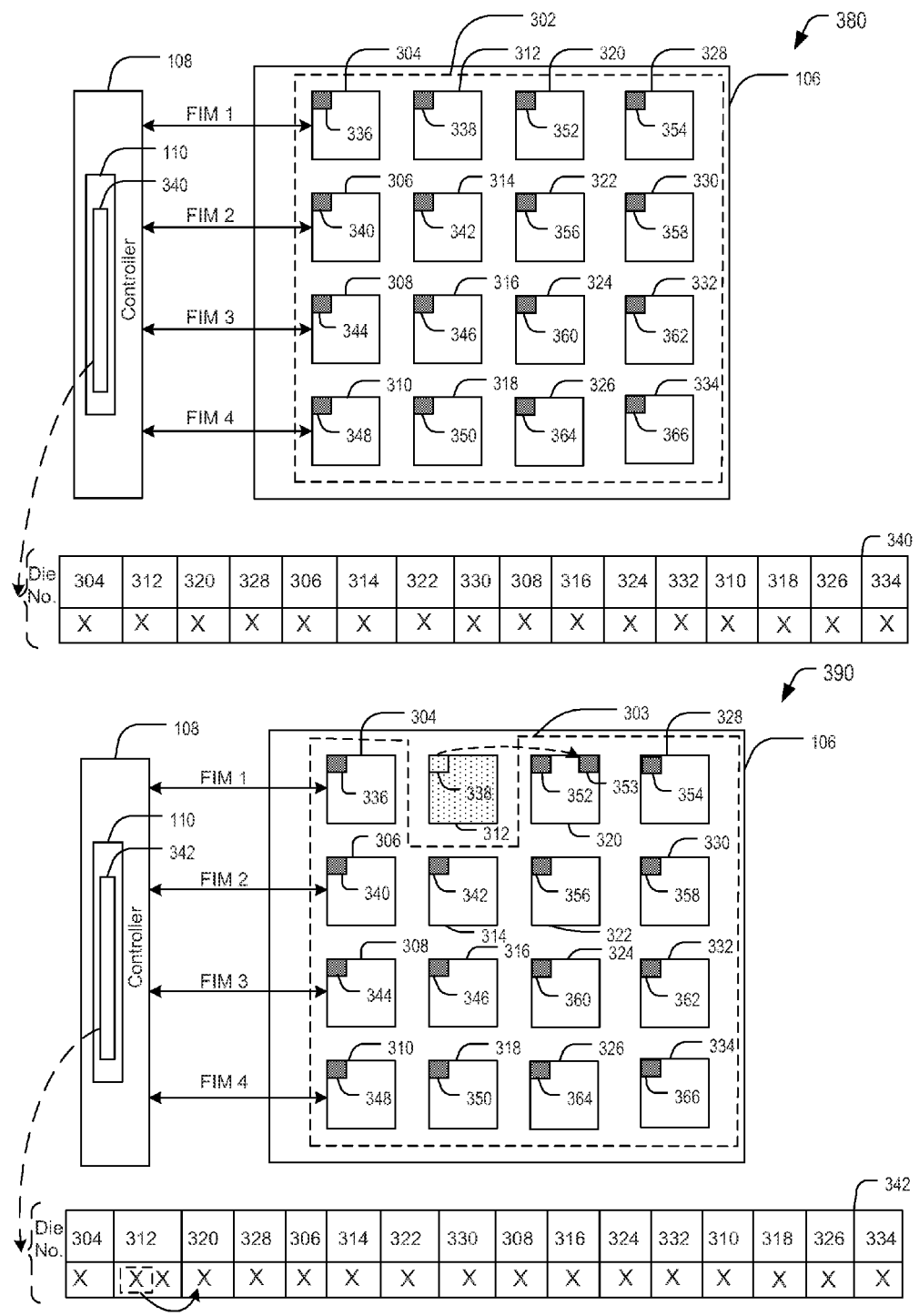
FIG. 3 is a general diagram illustrating a second embodiment of redefining a second metablock to exclude a particular storage block of a particular die of the data storage device of FIG. 1.

As described in further detail with respect to FIGS. 2-3, the controller 108 may be configured to define a metablock to include a first plurality of storage blocks that includes a first storage block located in a first die, such as die 112. Each storage block of the metablock may be located in a distinct die of a first plurality of dies of the memory 106. The controller 108 may be further configured to detect that a first temperature associated with the first die is equal to or exceeds a temperature threshold. In response to detecting that the first temperature is equal to or exceeds the temperature threshold, the controller 108 may be configured to redefine the metablock to form a redefined metablock that includes a second plurality of storage blocks. The redefined metablock may exclude all storage blocks located in the first die.

The controller 108 may be configured to update the metablock table 140 to indicate that a second storage block on a second die replaces the first storage block on a first die. For example, the controller 108 may replace a first indicator with a second indicator, the first indicator indicating the first storage block on the first die and the second indicator indicating the second storage block that is located outside of the first die, (i.e., on the second die). The controller 108 may be configured to transfer data from the first storage block to the second storage block to enable read access to the metablock while the first die cools.

In operation, the metablock assignment module 110 may define a metablock to include a first plurality of storage blocks, each of which may be located in a corresponding one of a plurality of the dies 112-126. Each metablock may be defined by the metablock assignment module 110 based in part on die temperature represented in the temperature data 128, as is described with regard to FIGS. 2 and 3. The metablock assignment module 110 may redefine a particular metablock based on updated temperature data 128. For example, when the temperature data 128 indicates that the die 118 has a die temperature that is equal to or exceeds a temperature threshold, the metablock assignment module 110 may redefine the metablock to include a second plurality of storage blocks that differs from the first plurality of storage blocks that was included in the original metablock.

Thus, in response to detecting that a temperature of a particular die (e.g., die 118) is too high, i.e., the temperature of the particular die is equal to or exceeds the temperature threshold, metablocks that include storage blocks on the particular die may be redefined to exclude all storage blocks from the particular die, e.g., die 118. The controller 108 may be configured to transfer data that is stored in storage blocks of the particular die to replacement storage blocks of other dies that are in the redefined metablocks. Alternatively, the controller 108 may be configured to permit write access to a redefined metablock without the controller 108 copying data to replacement storage blocks.

By redefining the metablock and transferring data stored from a die whose temperature is too high to a die that has a lower temperature, the data stored in the redefined metablock may continue to be accessed while addressing potential instability of the stored data due to thermal effects of storage elements within the die. The redefined metablock may be accessed by accessing all storage blocks of the redefined metablock substantially simultaneously, thus maintaining efficient access to the memory while enabling cooling of the overheated die.

The data storage device 102 therefore provides advantages over conventional systems that employ a throttling process to reduce the temperature of a die. Such throttling processes introduce periods of interruption in data access between the controller and all dies within the die package, and the periods of interruption prevent all data transfer and result in inefficient use of computing resources and wasted time. Redefining a metablock can result in greater performance and efficiency in use of computing resources.

FIG. 2 illustrates a first embodiment of redefining a first metablock to exclude a particular storage block of a particular die of the data storage device of FIG. 1. A particular embodiment 280 of the data storage device of FIG. 1 includes the memory 106 and the controller 108. In the embodiment 280, the memory 106 includes a total of sixteen dies 204-234. A metablock 202 is defined to include a storage block in each of the dies 204-218. The metablock 202 includes storage blocks 236, 238, 240, 242, 244, 246, 248, and 250, each of the storage blocks in a distinct die. Each of the storage blocks included in the metablock 202 is addressable by the same relative address within its die, illustrated as each of the storage blocks in the metablock 202 being located in the upper left corner of the corresponding die. By including storage blocks that have the same relative address on their corresponding dies, the controller 108 may read/write data to each of the storage blocks 236-250 substantially simultaneously. The dies 220-234 do not include any storage blocks that are part of the metablock 202.

Also shown in the embodiment 280 is a metablock table 240 that is a particular instance of the metablock table 140 of FIG. 1. The metablock table 240 indicates which of the dies within the memory 106 includes a storage block that is part of the metablock 202. Thus, the metablock table 240 defines the makeup of the metablock 202.

Data may be transferred between the controller 108 and the memory 106 via flash interface modules (FIM), including FIM 1, FIM 2, FIM 3, and FIM 4. Each of the FIMs shown may serve to exchange data between the controller and a subset of all dies in the memory. For instance, FIM 1 may provide a first channel between the controller 108 and each of dies 204, 212, 220, and 228 that may be in a first package. FIM 2 may provide a second channel between the controller 108 and each of dies 206, 214, 222, and 230 that may be in a second package. FIM 3 may provide a third channel between the controller 108 and each of dies 208, 216, 224, and 232 that may be in a third package. FIM 4 may provide a fourth channel between the controller 108 and each of dies 210, 218, 226, and 230 that may be in a fourth package.

When a temperature associated with one of the dies is equal to or exceeds a temperature threshold (i.e., equals or exceeds a threshold value that may indicate an overheated or nearly overheated die), the data stored in the die may become unstable. In order to protect stored data and to permit further access to the data and or to a replacement storage block, the metablock 202 may be redefined.

A second embodiment 290 illustrates a redefined metablock 203. A temperature associated with die 212 (as measured by a temperature sensor, not shown) is equal to or exceeds a temperature threshold, indicating overheating or nearly overheating of the die 212. The redefined metablock 203 includes a storage block 239 in the die 220 and excludes the storage block 238 in the die 212. Each of the other storage blocks from the metablock 202 is included in the redefined metablock 203. That is, the redefined metablock 203 includes storage blocks 236, 239, 240, 242, 244, 246, 248, and 250. Data that has been stored in the storage block 238 may be transferred to the storage block 239.

The storage block 239 is located at the same relative address in die 220 as each other storage block with respect to its corresponding die in the redefined metablock 203. This arrangement of storage blocks is an example of "parallelism," and enables each of the storage blocks in the redefined metablock 203 to be addressed substantially simultaneously. An updated metablock table 242 specifies storage blocks in the redefined metablock 203. In the updated metablock table 242 an indicator X indicating the storage block 238 in die 212, has been moved to indicate the storage block 239 present in die 220, corresponding to redefining the metablock 202 to form the redefined metablock 203.

An advantage of redefining the metablock 202 to the redefined metablock 203 is continued write access to all storage blocks of the redefined metablock 203 including simultaneous write and/or erase of all of the storage blocks of the redefined metablock 203 while avoiding throttling. When the data that has been stored in the storage block 238 has been transferred to the storage block 239, the redefined metablock 203 also allows for continued read access, substantially simultaneously, of all of the storage blocks of the redefined metablock 203 while avoiding throttling.

When the die 212 cools down to a temperature below the threshold temperature, the metablock assignment module 110 may leave the redefined metablock 203 intact, or may revert to the metablock 202. For example, the metablock assignment module 110 may replace the redefined metablock 203 by re-forming the metablock 202 that enables substantially simultaneous write access to all storage blocks 236-250 of the metablock 202. Additionally, the controller 108 may transfer stored data from storage block 239 to storage block 238 to permit substantially simultaneous read access to the stored data of the metablock 202.

In another embodiment, metablock redefinition may be performed based on a temperature of a package of dies instead of, or in addition to, the metablock redefinition being based on individual die temperature. For example, a first package of dies may include a plurality of dies, e.g., dies 204, 212, 220, and 228. The first package of dies may have a package temperature that reflects an internal temperature of the package of dies. Due to heating effects including conduction and internal heat generation, the package temperature may equal or exceed a package temperature threshold. (For example, the package temperature threshold may be equal to the temperature threshold that is associated with a die.) In response to the package temperature being equal to or exceeding the package temperature threshold, a metablock that includes one or more dies residing in the first package of dies may be redefined to exclude from that metablock any storage block residing in the first package of dies. Upon cooling of the first package of dies to a temperature below the package temperature threshold, the redefined metablock may be reconfigured to include one or more of the previously excluded storage blocks.

FIG. 3 illustrates a second embodiment of redefining a second metablock 302 to exclude a particular storage block of a particular die of the data storage device 102 of FIG. 1. A particular embodiment 380 of the data storage device 102 of FIG. 1 includes the memory 106 and the controller 108. The controller 108 is in communication with the memory 106 via FIM 1, FIM 2, FIM 3, and FIM 4. The metablock 302 includes a distinct storage block in each of the dies 304-334. For example, the storage block 336 of the metablock 302 is located in the die 304, the storage block 338 of the metablock 302 is located in the die 312, etc. The metablock 302 includes storage blocks 336-366. A metablock table 340 includes an indicator of each storage block within the corresponding die (indicated by die number) of the metablock 302.

A second embodiment 390 illustrates a redefined metablock 303 that redefines the metablock 302 in response to a temperature of the die 312 being equal to or exceeding a temperature threshold. In redefining metablock 302, the storage block 338 is replaced by a storage block 353 included in the die 320 in the redefined metablock 303.

The redefined metablock 303 excludes all storage blocks in the die 312. The redefined metablock 303 permits continued write access to all storage blocks of the redefined metablock 303. By relocating data stored at the storage block 338 to the storage block 353, the redefined metablock 303 protects the data that was stored in storage block 338 from instability due to excessive temperature and also provides continuous read access to the replacement storage block 353.

The storage block 353 is located at a different address within the die 320 than the relative address of every other die in the redefined metablock 303. Because the relative address of the replacement storage block 353 differs from all of the other storage blocks in the redefined metablock 303, accessing the storage blocks in the redefined metablock 303 may not happen substantially simultaneously (i.e., no parallelism). Instead, the storage block 353 may be addressed at a first time, and each of the other storage blocks of the redefined metablock 303 may be addressed, substantially simultaneously, at a second time. Although in some implementations not all of the storage blocks of the redefined metablock 303 can be addressed substantially simultaneously, the redefined metablock 303 may permit accessing all of the storage blocks within two access times, such as in two successive clock cycles. Such a metablock arrangement is more time efficient than accessing each storage block at a distinct time.

When the die 312 cools down to a temperature below the threshold temperature, the metablock assignment module 110 may leave the redefined metablock 303 intact, or replace the redefined metablock 303 by re-forming the metablock 302, as shown in the embodiment 380. If the metablock 302 is re-formed, the controller 108 may transfer stored data from the storage block 353 to the storage block 338, permitting substantially simultaneous read access to stored data of the metablock 302.

In the first and second embodiments depicted in FIGS. 2 and 3, the replacement storage block may be located on a second die conditioned upon a second temperature associated with the second die being less than the temperature threshold. Each of the dies containing one or more of the storage blocks of the redefined metablock may have a corresponding temperature that is less than the temperature threshold.

Although redefining a metablock is depicted in FIGS. 2-3 as including remapping of a storage block from an initial die to an adjacent die, in other embodiments, the remapping of the storage block may be from the initial die to any other die of the memory 106. Although FIGS. 2-3 depict four dies in each die package, in other embodiments any number of dies may be included within a die package of the memory 106. Although a single representative metablock is depicted in FIGS. 2-3, in other embodiments multiple metablocks may be defined by the metablock assignment module 110. Additionally, in some embodiments the metablock table 140 may be stored in the memory 106.

Figure 4:
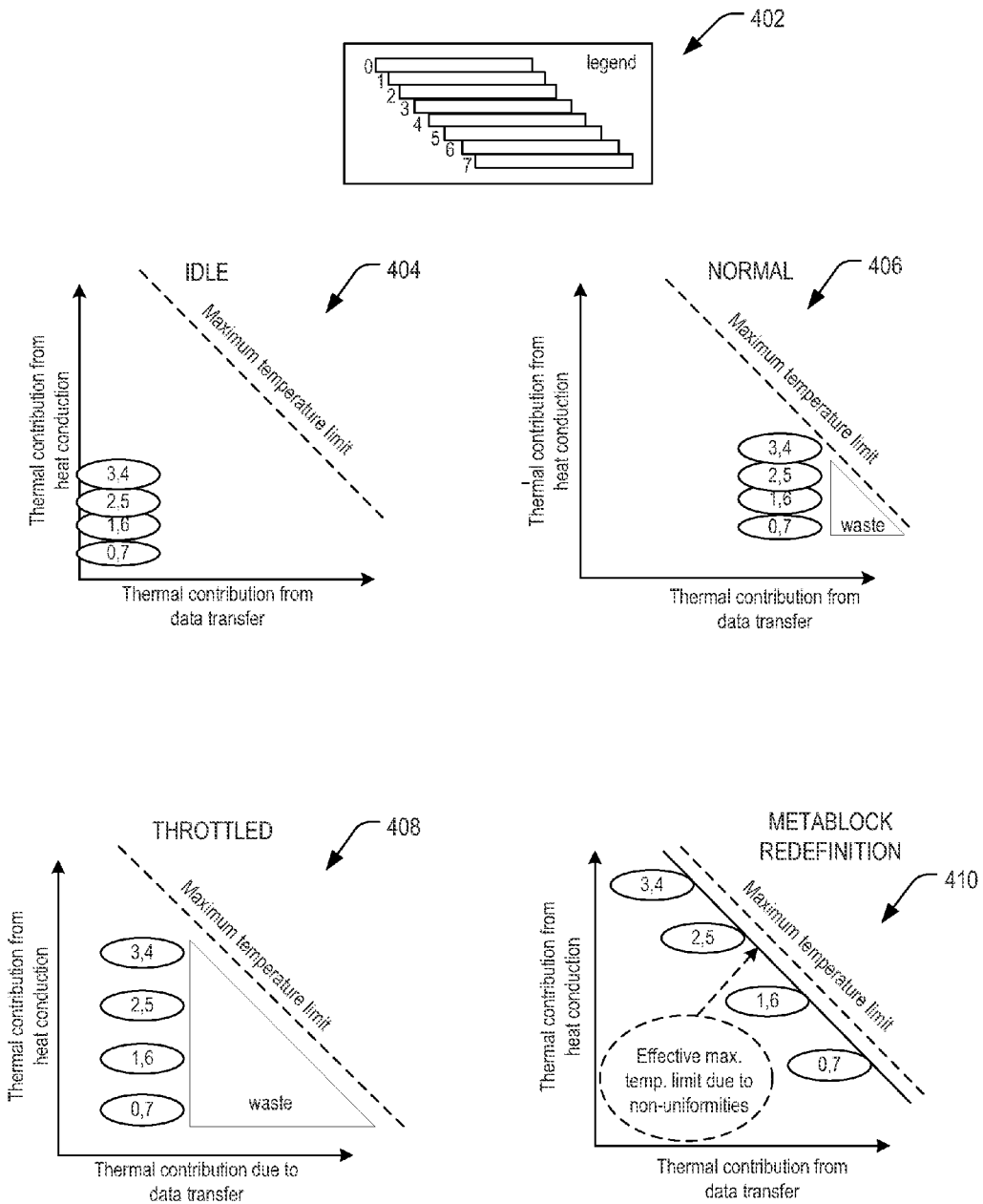
FIG. 4 is a set of graphs illustrating thermal characteristics associated with transfer of data to and from a memory.

FIG. 4 includes graphs illustrating various temperature conditions and techniques of cooling dies within a memory, such as the memory 106 of FIG. 1. A legend 402 labels dies 0-7 within a stack of dies in the memory.

A first graph 404 depicts an idle period during which no data is being read or written to the memory 106. The first graph 404 illustrates that each die has thermal contributions from two sources—data transfer to or from the die and heat conduction resulting from adjacent dies. As illustrated in the first graph 404, during an idle period none of the dies has an associated temperature that is equal to or greater than a maximum temperature limit, which could cause instability of the data in the die. The first graph 404 includes a dashed line that is designated "maximum temperature limit." When a die has a temperature exceeding the maximum temperature limit, data stored in the die may be unstable.

As seen in the first graph 404, dies 0 and 7 behave similarly and are displayed at the same position within the first graph 404 by virtue of their relative outer locations within the stack of dies (see legend 402). Dies 1 and 6 have similar thermal characteristics to one another, dies 2 and 5 have similar thermal characteristics to one another, and interior dies 3 and 4 have similar thermal characteristics to one another.

In the first graph 404, none of the dies has achieved the maximum temperature limit. Therefore, no action is needed regarding temperature effects for data that is stored, or to be stored, on any of the dies 0-7.

A second graph 406 illustrates that data transfer is occurring and each of the dies 0-7 has a consequent elevated temperature. Interior dies 3 and 4 have a temperature that borders the maximum temperature limit. In the scenario depicted in 406, a single data transfer rate (shown as all dies having the same position along the x-axis) results in each die having the same thermal contribution due to data transfer. In order to avoid having dies 3 and 4 exceed the maximum temperature limit, the same data transfer rate is adopted by all of the dies. Because the thermal contribution to each die due to data transfer is approximately the same, by maintaining the temperature of dies 3 and 4 beneath the maximum temperature limit, direct data transfer rates of dies 2 and 5, 1 and 6, and 0 and 7 are maintained at a rate that is sub-optimal (i.e., less than could be achieved while remaining below the maximum temperature limit). The lack of utilization of additional data transfer capacity among dies 2, 5, 1, 6, and 0, 7 is illustrated by a triangular portion of the x-y plane (that is labeled "waste"), an indication that data transfer of the memory as a whole is less than capacity.

A third graph 408 indicates results of a particular technique to keep all of the dies beneath the maximum temperature limit. The technique, known as "throttling," involves inserting periods of non-activity at the memory, during which no reads or writes to any of the dies takes place. By inserting periods of non-activity, heat generated due to data transfer will be reduced and all of the dies can remain beneath the temperature limit. However, as shown in the third graph 408, a larger triangle of waste is shown, indicating a loss of computing efficiency associated with use of the throttling technique.

A fourth graph 410 illustrates the use of redefinition of metablocks in order to increase computing efficiency, such as described with respect to FIGS. 1-3. By treating each of the dies individually and redefining a metablock that includes a storage block in a particular die when the temperature of the particular die is at the maximum temperature limit (i.e., is equal to or exceeds a temperature threshold), more data can be transferred during a specified time period than if the throttling technique were employed. For example, when the die 3 reaches its maximum temperature limit, by redefining the metablock that includes a first storage block in die 3 to a redefined metablock that replaces the storage block in die 3 by a second storage block in die 2, data transfer can occur without implementing the throttling illustrated in the third graph 408.

In another example, the metablock can be redefined by replacing the storage block in die 3 by a third storage block in die 0. Because die 0 is at an outer position of the stack of dies, there may be less thermal contribution received via conductance from adjacent dies than for die 3, and therefore more data transfer can occur to the third storage block in die 0 after its temperature limit is reached than for the first storage block in die 3. By reducing but not eliminating all data transfer with die 3 (e.g., by redefining some, but not all metablocks to exclude die 3), an overall data transfer rate to the memory may be increased. Thus, by including metablock redefinition, data transfer can occur in a more time-efficient and computationally efficient manner.

In practice, each of the dies in the fourth graph 410 may border a solid line (labeled "effective maximum temperature limit due to non-uniformities") that is at a slightly lower temperature than the maximum temperature limit. The solid line results from non-uniformity within any particular die and/or between dies that causes a lower effective maximum temperature limit.

Figure 5:
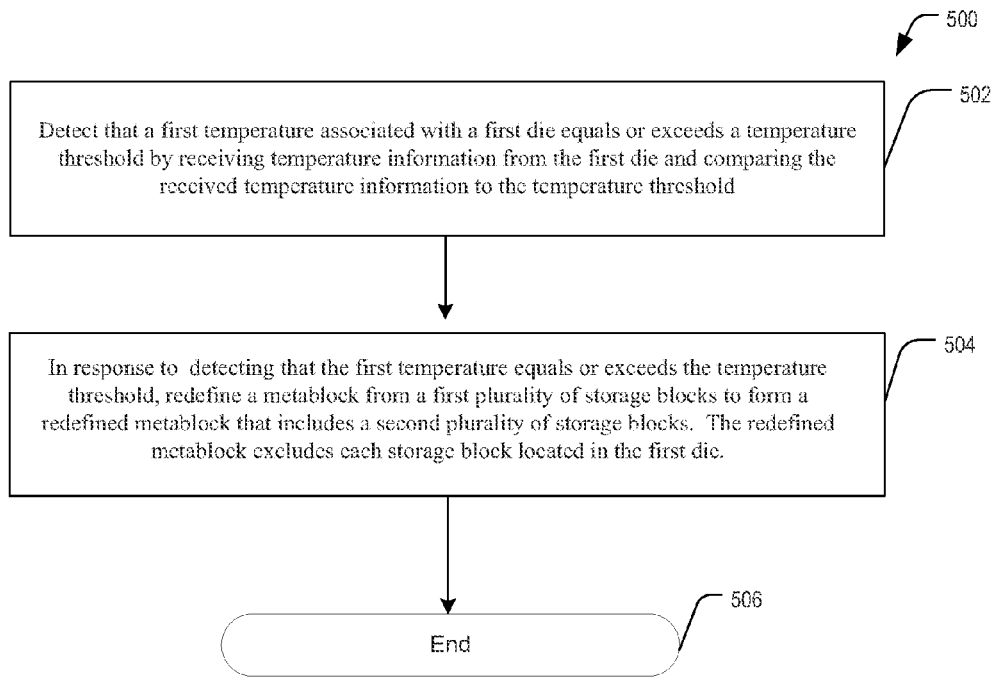
FIG. 5 is a flow chart of a particular embodiment of a method of redefining a metablock of a memory within a storage device.

FIG. 5 depicts a flow diagram of a method 500 of managing data transfer. A first temperature associated with a first die may be detected as equal to or exceeding a temperature threshold, at 502. Detection may include receiving temperature information from the first die and comparing the received temperature information to the temperature threshold. For example, in FIG. 1, temperature information associated with the die 118 may be detected by the temperature sensor 156. The temperature information may be received from the die 118 as the temperature data 128 and may be compared to the temperature threshold by the controller 108.

In response to detecting that the temperature of the first die equals or exceeds the temperature threshold, a metablock that includes a first plurality of storage blocks including a first storage block of the first die may be redefined to form a redefined metablock that includes a second plurality of storage blocks, at 504. The redefined metablock excludes the first storage block of the first die.

For example, as illustrated in FIG. 2, the metablock 202, including the first plurality of storage blocks 236-250, may be redefined to form the redefined metablock 203 that includes storage blocks 236, 239, and 240-250. The redefined metablock 203 excludes the storage block 238 of the die 212. In another example illustrated in FIG. 3, the metablock 302, including the first plurality of storage blocks 336-366, may be redefined to form the redefined metablock 303 that includes storage blocks 336, 340-352, 353, and 354-366. The redefined metablock 303 excludes the storage block 338 of the die 312. The method ends at 506.

Redefining the metablock enables access by a controller to each storage block of a second plurality of storage blocks. For example, in FIG. 2, redefining the metablock 202 to the redefined metablock 203 enables access by the controller 108 to each of the second plurality of storage blocks that includes the storage blocks 236, 239, and 240-250. As another example, in FIG. 3, redefining the metablock 302 to the redefined metablock 303 enables access by the controller 108 to each of the storage blocks 336, 340-352, 353, and 354-366.

Access by the controller to the first storage block of the metablock may be prohibited while the temperature of the first die is equal to or exceeds a temperature threshold. For example, in FIG. 2, access by the controller 108 to the storage block 238 is prohibited while the temperature of the die 212 is equal to or exceeds the temperature threshold. In another example, in FIG. 3, access by the controller 108 to the storage block 338 is prohibited while the temperature of the die 312 is equal to or exceeds the temperature threshold.

At a later time the temperature of the die may drop to a value below the temperature threshold. When the temperature of the die drops to a value below the temperature threshold, the die may again be used to store data. For example, in FIG. 2, when the temperature of the die 212 falls below the temperature threshold, access by the controller 108 to the storage block 238 may again be permitted. When the temperature of the die 212 falls and remains below the temperature threshold, the metablock assignment module 110 may utilize the redefined metablock 203 or may revert from the redefined metablock 203 to the metablock 202.

In another example, in FIG. 3, when the temperature of the die 312 falls to a value below the temperature threshold, access by the controller 108 to the storage block 338 may again be permitted. When the temperature of the die 312 falls and remains below the temperature threshold, the redefined metablock 303 may be returned to the metablock 302 or may be utilized as the redefined metablock 303. By reverting to the metablock 302, substantially simultaneous access to each storage block 336-366 of the metablock 302 may be restored.

The second plurality of storage blocks in the redefined metablock may include a second storage block in a second die of the plurality of dies. The second plurality of storage blocks may include storage blocks in addition to those included in the first plurality of storage blocks. For example, in FIG. 2 the redefined metablock 203 includes a second plurality of storage blocks that includes storage block 239 in die 220 and storage blocks 236, 240-250 that are included in a first plurality of storage blocks of the metablock 202. In another example depicted in FIG. 3, the redefined metablock 303 includes storage block 353 in die 320 and also includes storage blocks 336 and 340-366 that are included in a first plurality of storage blocks of the metablock 302.

Redefining the metablock may include updating a metablock table that specifies each storage block in the metablock. Updating the metablock table can include replacing a first indicator with a second indicator, the first indicator indicating the first storage block and the second indicator indicating a second storage block that is located outside of the first die. For example, FIG. 2 illustrates a metablock table 240 associated with the metablock 202. In a redefined metablock 242, a first indicator within the metablock table 240, corresponding to die 212, is replaced within the metablock table 242 by a second indicator that corresponds to die 220.

Redefining the metablock may include transferring first data from the first storage block to the second storage block of the second die of the plurality of dies and including the second storage block in the redefined metablock. For example, in FIG. 2 redefining the metablock 202 can include transferring first data from the storage block 238 to the storage block 239 in the redefined metablock 203. In FIG. 3, redefining the metablock 302 can include transferring first data from the storage block 338 to the storage block 239 in the redefined metablock 303.

The second storage block may be included in the second plurality of storage blocks conditioned upon a second temperature associated with the second die being less than the temperature threshold. For example, in FIG. 2, storage block 239 can be included in the redefined metablock 203 (that additionally includes storage blocks 236 and 240-250) conditioned upon a temperature associated with the die 220 being less than a temperature threshold, such as the maximum temperature limit depicted in graphs 404-410 in FIG. 4. As another example, in FIG. 3, storage block 353 can be included in the redefined metablock 303 (that additionally includes storage blocks 336, 340-350, and 354-366) conditioned upon a temperature associated with the die 320 being less than a temperature threshold, such as the maximum temperature limit depicted in graphs 404-410 in FIG. 4.

In a particular embodiment, the metablock includes not more than one storage block from each of the plurality of dies. For example, FIG. 2 shows that the metablock 202 includes one storage block from each of the dies 204-218. The redefined metablock 203 includes one storage block from each of the dies 204-210 and 214-220. In a particular embodiment, each of the storage blocks of the metablock has a same relative address on the corresponding die on which it is located. For example, FIG. 2 depicts that each of the storage blocks 236-250 has a same relative address on the corresponding die on which it is located. In FIG. 3, the metablock 302 includes storage blocks 336-366 that are depicted as having the same relative address on the corresponding die on which each of the storage blocks is located.

In another embodiment, the second die includes a third storage block that is included in the second plurality of storage blocks. For example, in the redefined metablock 303 of FIG. 3, the die 320 includes storage block 353 and storage block 352 in a second plurality of storage blocks (i.e., storage blocks 336 and 340-366) of the redefined metablock 303.

The method may include processing data stored in the redefined metablock. Processing may include addressing each block of the second plurality of data blocks substantially simultaneously. For example, in FIG. 2, each storage block 236, 239, and 240-250 in the redefined metablock 203 can be addressed substantially simultaneously. In an embodiment, after redefining the metablock, the second plurality of storage blocks is erasable substantially simultaneously. For example, in FIG. 2, each storage block 236, 239, and 240-250 in the redefined metablock 203 is erasable substantially simultaneously.

The method may include redefining a second metablock in response to detecting that the first temperature is equal to or exceeds the temperature threshold. The redefined second metablock may exclude a fourth storage block that is in the first die and the first storage block in the first die, and may include a fifth storage block in a third die of the plurality of dies. In an example, the second metablock includes a corresponding storage block in each of the dies of the first metablock (including the fourth storage block in the first die). The second metablock differs from the first metablock; i.e., each of the storage blocks of the second metablock differs from the storage blocks of the first metablock. Each storage block of the second metablock has a same relative address within its die, enabling substantially simultaneous access to the storage blocks of the second metablock. In response to detecting that the first temperature of the first die is equal to or exceeds the temperature threshold, the second metablock may be redefined to exclude storage blocks of the first die (e.g., to exclude the fourth storage block). The redefined second metablock may include the fifth storage block in the third die, replacing the fourth storage block of the first die. For example, in FIG. 2 the second metablock may include storage blocks located in a lower left corner of each of dies 204-218, including the fourth storage block (not shown) located in the lower left hand corner of the die 212. The redefined second metablock excludes the fourth storage block in the die 212 and includes the fifth storage block (not shown) that is located in the lower left hand corner of the die 220. Excluding the fourth storage block from the redefined second metablock may reduce a thermal contribution to the first die resulting from data transfer to and from the fourth storage block, which may result in a reduction in the first temperature of the first die.

Although various components depicted herein are illustrated as block components and described in general terms, such components may include one or more microprocessors, state machines, or other circuits configured to enable the data storage device 102 of FIG. 1 to perform the particular functions attributed to such components, or any combination thereof. For example, the metablock assignment module 110 of FIG. 1 may represent physical components, such as hardware controllers, state machines, logic circuits, or other structures to enable the data storage device 102 of FIG. 1 to monitor temperature of one or more dies in the memory 106, compare temperatures to a temperature threshold, redefine a metablock based on temperatures of the dies that include storage blocks of the metablock, transfer data from a first storage block to a second storage block in response to a temperature of a die being equal to or exceeding the temperature threshold or any combination thereof.

The metablock assignment module 110 may be implemented using a microprocessor or microcontroller programmed to perform one or more of detecting that a temperature of a die exceeds a temperature threshold, determining whether a metablock includes a block of the die whose temperature is equal to or exceeds the temperature threshold, and remapping the metablock to exclude storage blocks on the die whose temperature exceeds the temperature threshold. In a particular embodiment, the metablock assignment module 110 includes a processor executing instructions that are stored at the memory 106. Alternatively, or in addition, executable instructions that are executed by the processor may be stored at a separate memory location that is not part of the nonvolatile memory 106, such as at a read-only memory (ROM).

In a particular embodiment, the data storage device 102 may be a portable device configured to be selectively coupled to one or more external devices. For example, the data storage device 102 may be a removable device such as a Universal Serial Bus (USB) flash drive or a removable memory card, as illustrative examples. However, in other embodiments, the data storage device 102 may be attached or embedded within one or more host devices, such as within a housing of a portable communication device. For example, the data storage device 102 may be within a packaged apparatus such as a wireless telephone, a personal digital assistant (PDA), a gaming device or console, a portable navigation device, a computer device, or other device that uses internal non-volatile memory. In a particular embodiment, the data storage device 102 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a storage device with a controller and a nonvolatile memory, the nonvolatile memory including a plurality of dies, wherein each of the plurality of dies includes at least one storage block, wherein the controller is operative to define and redefine a first metablock, the first metablock being defined to include storage blocks with each storage block of the first metablock residing in a distinct die of the plurality of dies, one of the plurality of dies being a first die, performing:
   detecting that a first temperature associated with the first die equals or exceeds a temperature threshold by receiving temperature information associated with the first die and comparing the received temperature information to the temperature threshold;
   in response to detecting that the first temperature equals or exceeds the temperature threshold:
   redefining the first metablock to exclude from the redefined first metablock any storage block associated with the first die, wherein a first storage block associated with the first die is included in a second metablock, and
   transferring data from the first die to a third metablock.

2. The method of claim 1, wherein the first metablock enables access to each storage block, and wherein as a result of being redefined, the redefined first metablock prohibits access to any block associated with the first die while the temperature of the first die equals or exceeds the temperature threshold.

3. The method of claim 1, wherein redefining the first metablock includes updating a metablock table that specifies each storage block in the first metablock, wherein updating the metablock table includes replacing a first indicator with a second indicator, the first indicator indicating the first storage block and the second indicator indicating a second storage block that is located outside of the first die.

4. The method of claim 1, wherein redefining the first metablock includes:

transferring first data from the first storage block of the first die to a second storage block of a second die of the plurality of dies; and including the second storage block in the redefined first metablock.

5. The method of claim 1, wherein after redefining the first metablock, a second plurality of storage blocks is erasable substantially simultaneously.

6. The method of claim 1, further comprising processing data stored in the redefined first metablock, wherein processing the data includes addressing each block of a second plurality of data blocks substantially simultaneously.

7. The method of claim 1, wherein a second plurality of storage blocks includes a second storage block in a second die of the plurality of dies and the second plurality of storage blocks includes additional storage blocks.

8. The method of claim 7, wherein the second storage block is included in the second plurality of storage blocks conditioned upon a second temperature associated with the second die being less than the temperature threshold.

9. The method of claim 7, wherein the second die includes a third storage block that is included in the second plurality of storage blocks.

10. The method of claim 1, wherein the first metablock includes not more than one storage block from each of the plurality of dies.

11. The method of claim 1, wherein each of the storage blocks of the first metablock has a same relative address on the corresponding die on which it is located.

12. The method of claim 1, wherein the first temperature corresponds to a package temperature of a package that includes the first die, and wherein redefining the first metablock further includes excluding any storage block in the package from the redefined first metablock.

13. An apparatus comprising:
a memory including a plurality of dies, wherein each of the plurality of dies includes at least one storage block; and
a controller configured to define and redefine a first metablock, the first metablock being defined to include a first plurality of storage blocks that includes storage blocks with each storage block of the first metablock residing in a distinct die of the plurality of dies, one of the plurality of dies being a first die, wherein the controller is further configured to detect that a first temperature associated with the first die is equal to or greater than a temperature threshold, and in response to detecting that the first temperature is equal to or greater than the temperature threshold:
to redefine the first metablock to form a redefined first metablock that excludes a first storage block from the redefined first metablock, wherein a storage block associated with the first die is included in a second metablock; and
to transfer data from the first die to a third metablock.

14. The apparatus of claim 13, wherein the controller is further configured to transfer first data stored in the first storage block of the first die to a second storage block within a second die of the plurality of dies.

15. The apparatus of claim 14, wherein a third storage block is included in a second plurality of storage blocks and is located in a third die.

16. The apparatus of claim 13, wherein the controller is configured to address each storage block of a second plurality of storage blocks substantially simultaneously.

17. The apparatus of claim 13, wherein a second storage block in a third die is included in a second plurality of storage blocks conditioned upon a second temperature associated with a second die being less than the temperature threshold.

18. The apparatus of claim 13, wherein the controller is configured, in response to receipt of an erase command, to erase each block of a second plurality of storage blocks substantially simultaneously.

19. The apparatus of claim 13, wherein the controller is configured to maintain a metablock table that specifies each storage block in the first metablock and further configured to update the metablock table, wherein updating the metablock table includes replacing a first indicator with a second indicator, the first indicator indicating that the first storage block is in the first metablock and the second indicator indicating that a second storage block is in the redefined first metablock, the second storage block located outside of the first die.

20. An apparatus comprising:
a memory including a plurality of dies, one of the dies being a first die, wherein each of the plurality of dies includes at least one storage block; and
a controller configured to:
define and redefine a first metablock, the first metablock being defined to include a first plurality of storage blocks of the first die;
monitor a temperature of each of the plurality of dies; and
in response to a temperature of a first storage block of the first die exceeding a threshold, to redefine the first metablock to include a second storage block of a second die of the plurality of dies and to exclude the first storage block from the first metablock, wherein the first storage block is included in a second metablock; and
to transfer data from the first die to a third metablock.

21. The apparatus of claim 20, wherein the controller is further configured to transfer the data stored in the first storage block after excluding the first storage block from the first metablock.

* * * * *